(12) United States Patent
Suzuki et al.

(10) Patent No.: US 10,665,605 B2
(45) Date of Patent: May 26, 2020

(54) NONVOLATILE SEMICONDUCTOR MEMORY DEVICE

(71) Applicant: TOSHIBA MEMORY CORPORATION, Minato-ku, Tokyo (JP)

(72) Inventors: Kunifumi Suzuki, Yokkaichi Mie (JP); Kazuhiko Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/122,842

(22) Filed: Sep. 5, 2018

(65) Prior Publication Data

US 2019/0287996 A1 Sep. 19, 2019

(30) Foreign Application Priority Data

Mar. 14, 2018 (JP) .................................. 2018-046905

(51) Int. Cl.
| | |
|---|---|
| *H01L 27/11582* | (2017.01) |
| *H01L 27/1157* | (2017.01) |
| *G11C 7/06* | (2006.01) |
| *G11C 16/24* | (2006.01) |
| *G11C 16/14* | (2006.01) |

(Continued)

(52) U.S. Cl.
CPC ......... *H01L 27/11582* (2013.01); *G11C 7/06* (2013.01); *G11C 16/0483* (2013.01); *G11C 16/08* (2013.01); *G11C 16/14* (2013.01); *G11C 16/24* (2013.01); *G11C 16/26* (2013.01); *H01L 27/1157* (2013.01)

(58) Field of Classification Search
CPC ......... H01L 27/11582; H01L 27/11514; H01L 27/11551; H01L 27/11578; H01L 27/11597; H01L 27/11529; G11C 16/08; G11C 16/26; G11C 16/0483; G11C 16/24; G11C 16/14
See application file for complete search history.

(56) References Cited

U.S. PATENT DOCUMENTS

| | | | |
|---|---|---|---|
| 8,445,881 B2 | 5/2013 | Awaya et al. | |
| 8,971,092 B2 * | 3/2015 | Kobayashi | H01L 27/2454 365/148 |

(Continued)

FOREIGN PATENT DOCUMENTS

| | | |
|---|---|---|
| JP | 2011-233551 A | 11/2011 |
| JP | 2017-168661 A | 9/2017 |

*Primary Examiner* — Hsien Ming Lee
(74) *Attorney, Agent, or Firm* — Foley & Lardner LLP

(57) ABSTRACT

According to one embodiment, a nonvolatile semiconductor memory device includes a first interconnect layer provided above a semiconductor substrate; a plurality of second interconnect layers provided above the first interconnect layer; a semiconductor layer electrically coupled to the first interconnect layer; a first insulating layer provided between the semiconductor layer and the plurality of second interconnect layers; and a plurality of first oxide layers in which one side of the first oxide layers is in contact with the plurality of second interconnect layers while the other side of the first oxide layers is in contact with the first insulating layer, and a voltage is applied to the plurality of second interconnect layers to vary a resistance value.

18 Claims, 10 Drawing Sheets

(51) Int. Cl.
  *G11C 16/04* (2006.01)
  *G11C 16/08* (2006.01)
  *G11C 16/26* (2006.01)

(56) References Cited

U.S. PATENT DOCUMENTS

| | | |
|---|---|---|
| 9,735,202 B1 | 8/2017 | Tanaka et al. |
| 2017/0271360 A1 | 9/2017 | Fujii et al. |
| 2017/0271403 A1* | 9/2017 | Yamamoto .......... H01L 45/1226 |
| 2018/0261651 A1* | 9/2018 | Hirayama ............. H01L 27/249 |

* cited by examiner

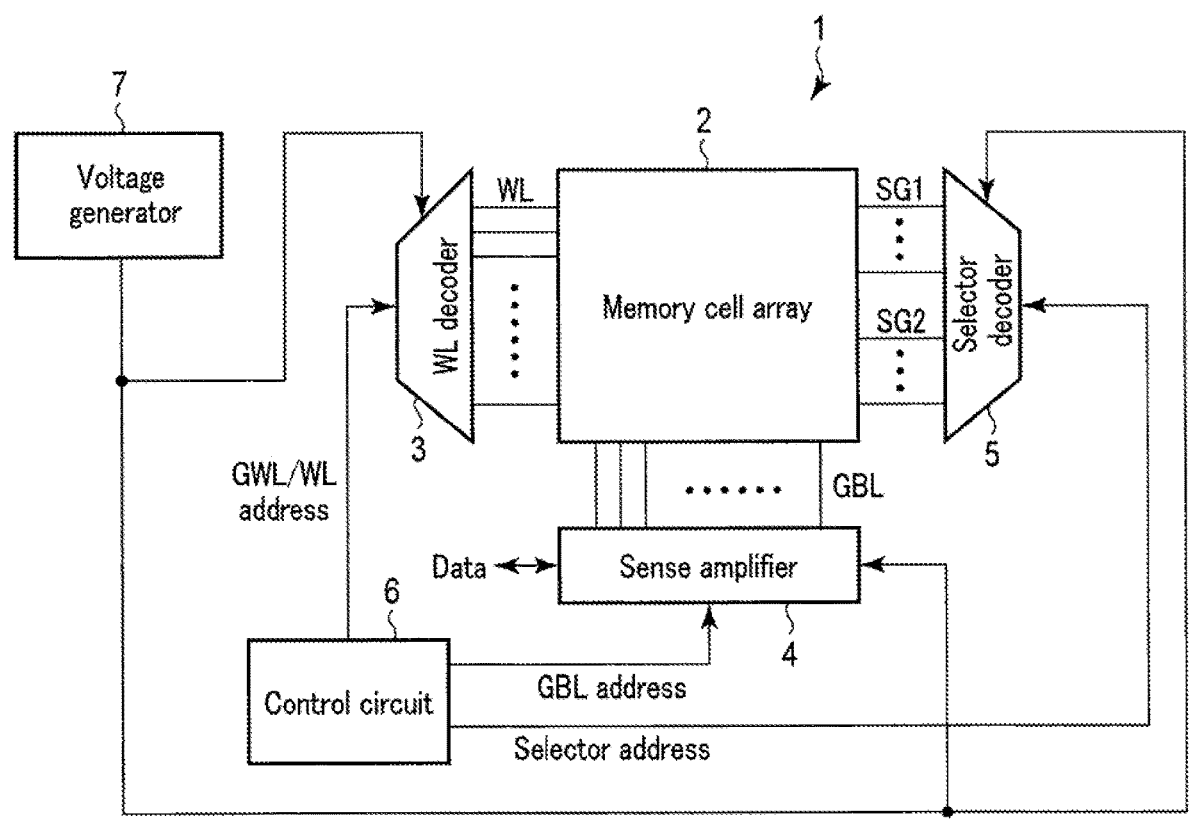
F I G. 1

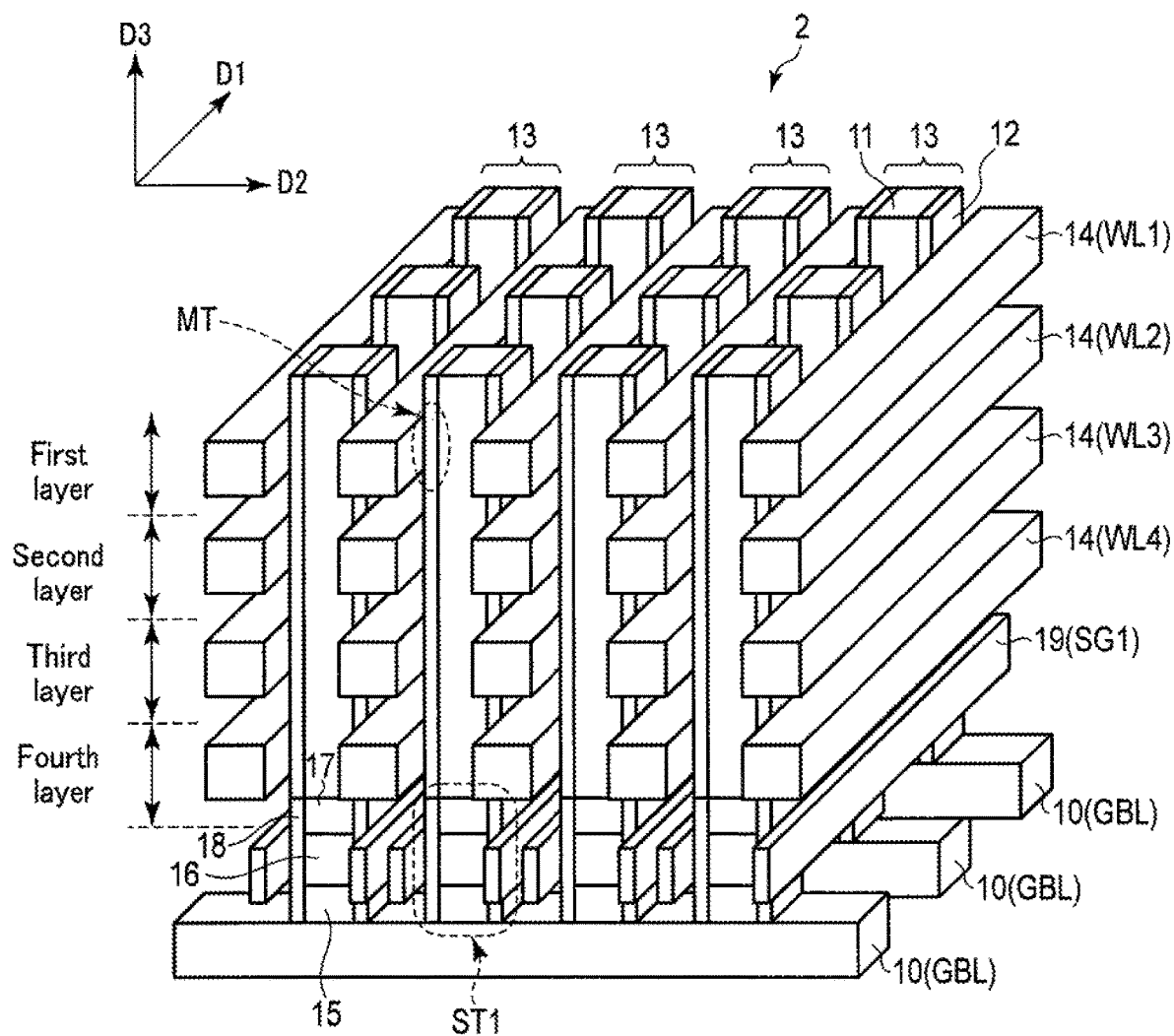
F I G. 2

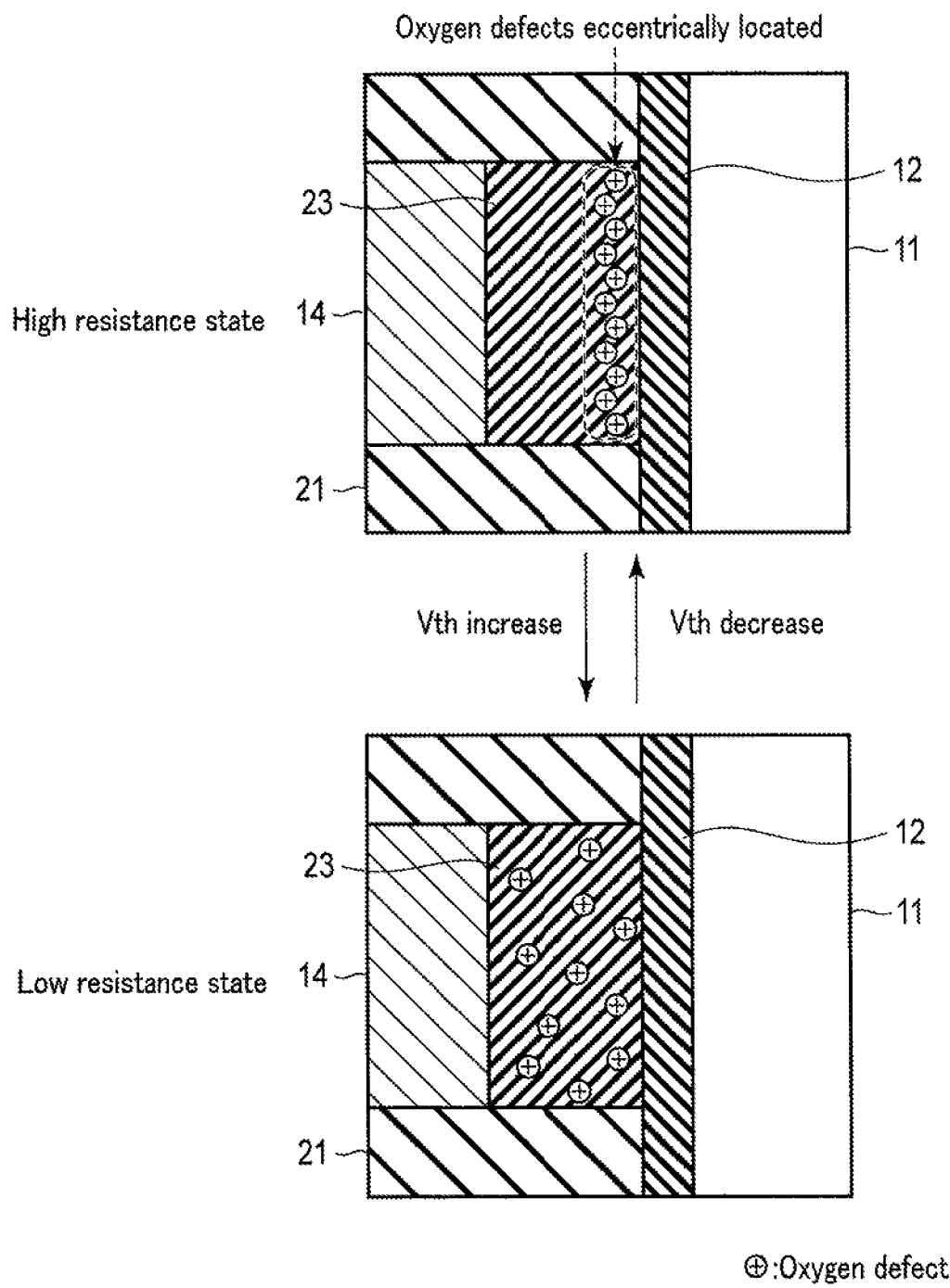
F I G. 4

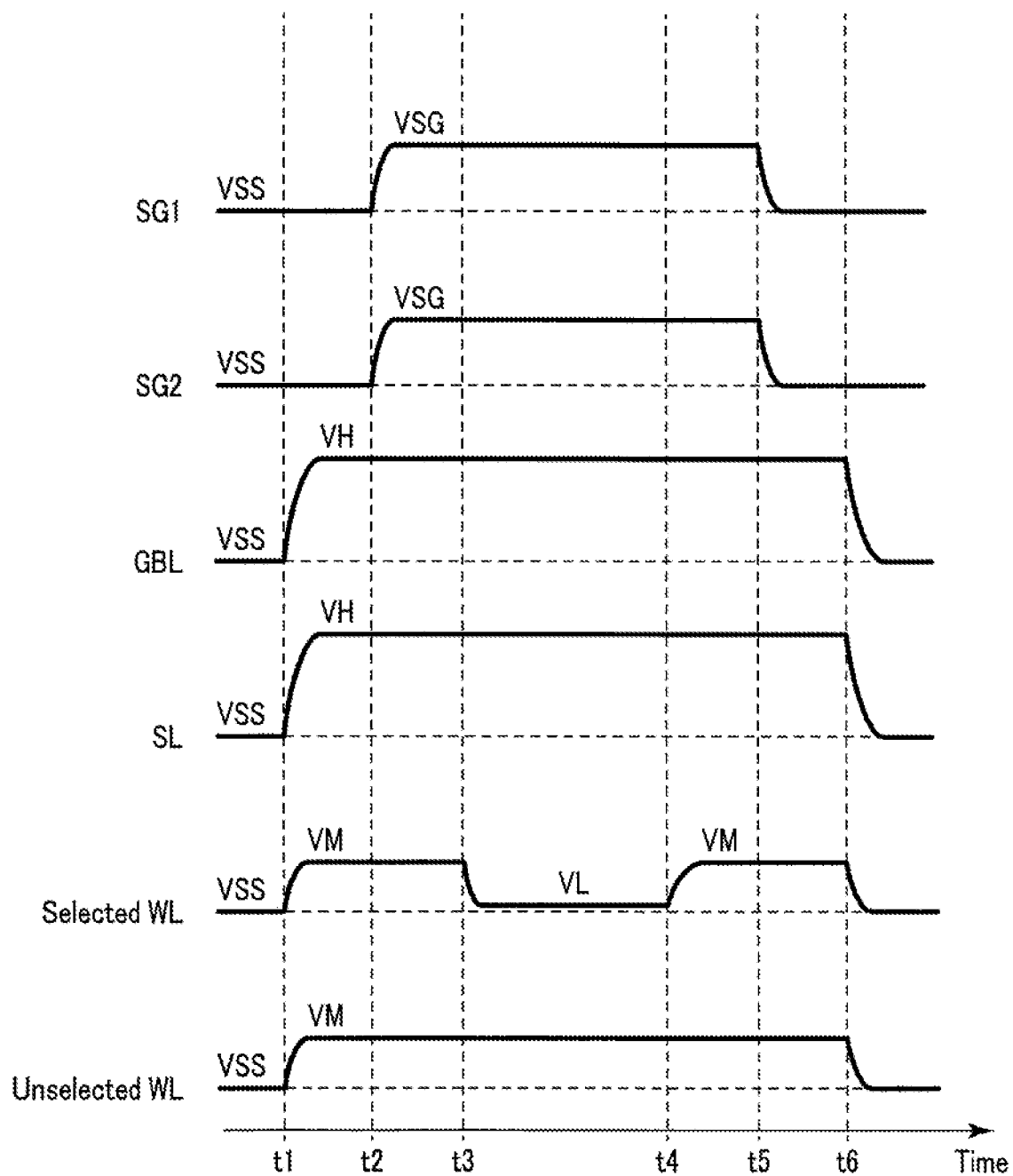
F I G. 7

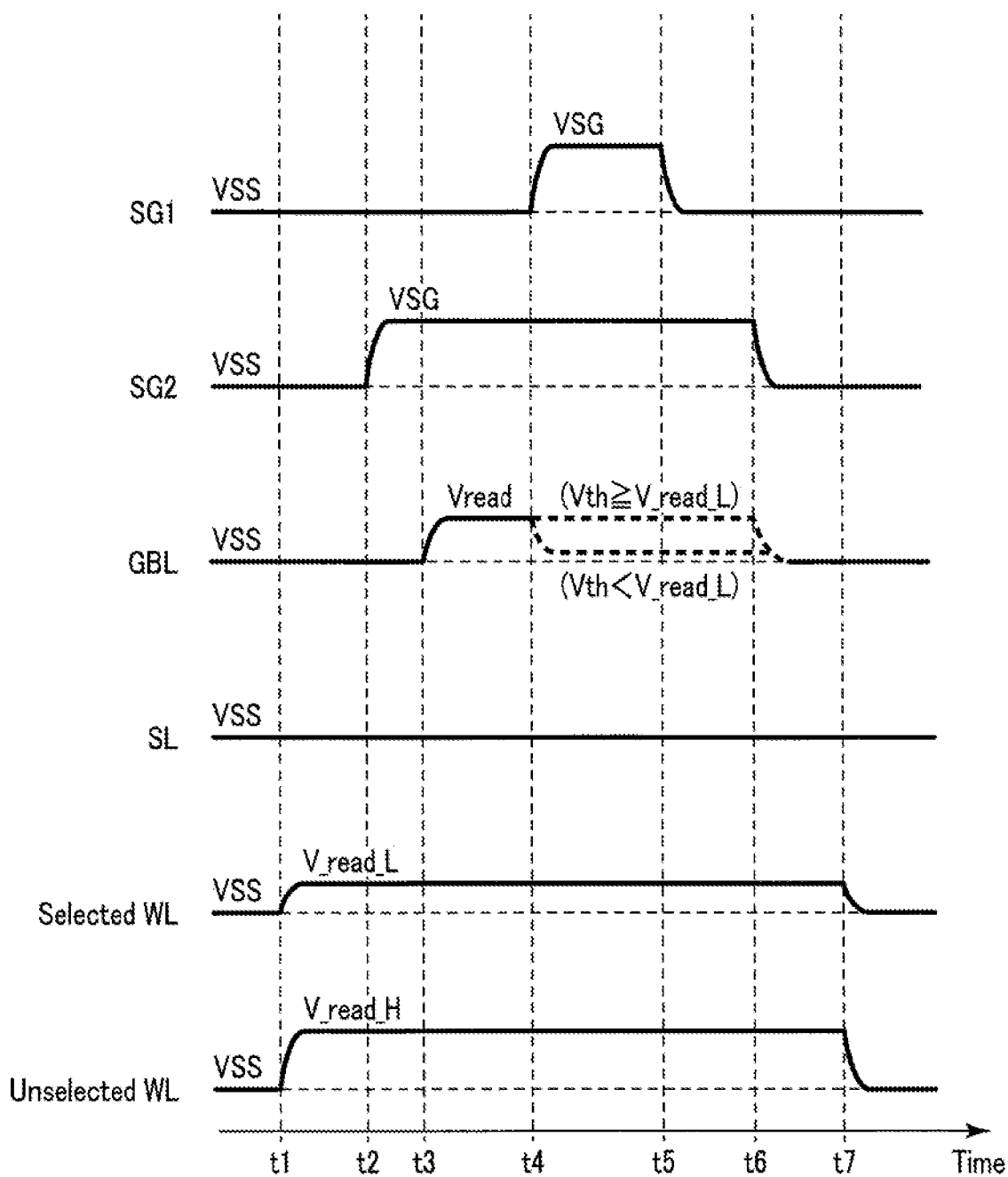
F I G. 8

NONVOLATILE SEMICONDUCTOR MEMORY DEVICE

CROSS-REFERENCE TO RELATED APPLICATIONS

This application is based upon and claims the benefit of priority from Japanese Patent Application No. 2018-046905, filed Mar. 14, 2018, the entire contents of which are incorporated herein by reference.

FIELD

Embodiments described herein relate generally to a nonvolatile semiconductor memory device.

BACKGROUND

Nonvolatile semiconductor memory devices include ones that store information by variations in threshold voltages of memory cell transistors.

BRIEF DESCRIPTION OF THE DRAWINGS

FIG. 1 is a block diagram of a nonvolatile semiconductor memory device according to a first embodiment;

FIG. 2 is a perspective view of a memory cell array in the nonvolatile semiconductor memory device according to the first embodiment;

FIG. 4 is a diagram showing a transition of the threshold voltage in the memory cell transistor in the nonvolatile semiconductor memory device according to the first embodiment;

FIG. 7 shows voltages of interconnects during a program operation in the nonvolatile semiconductor memory device according to the first embodiment;

FIG. 8 shows voltages of interconnects during a read operation in the nonvolatile semiconductor memory device according to the first embodiment;

DETAILED DESCRIPTION

Figure 3:
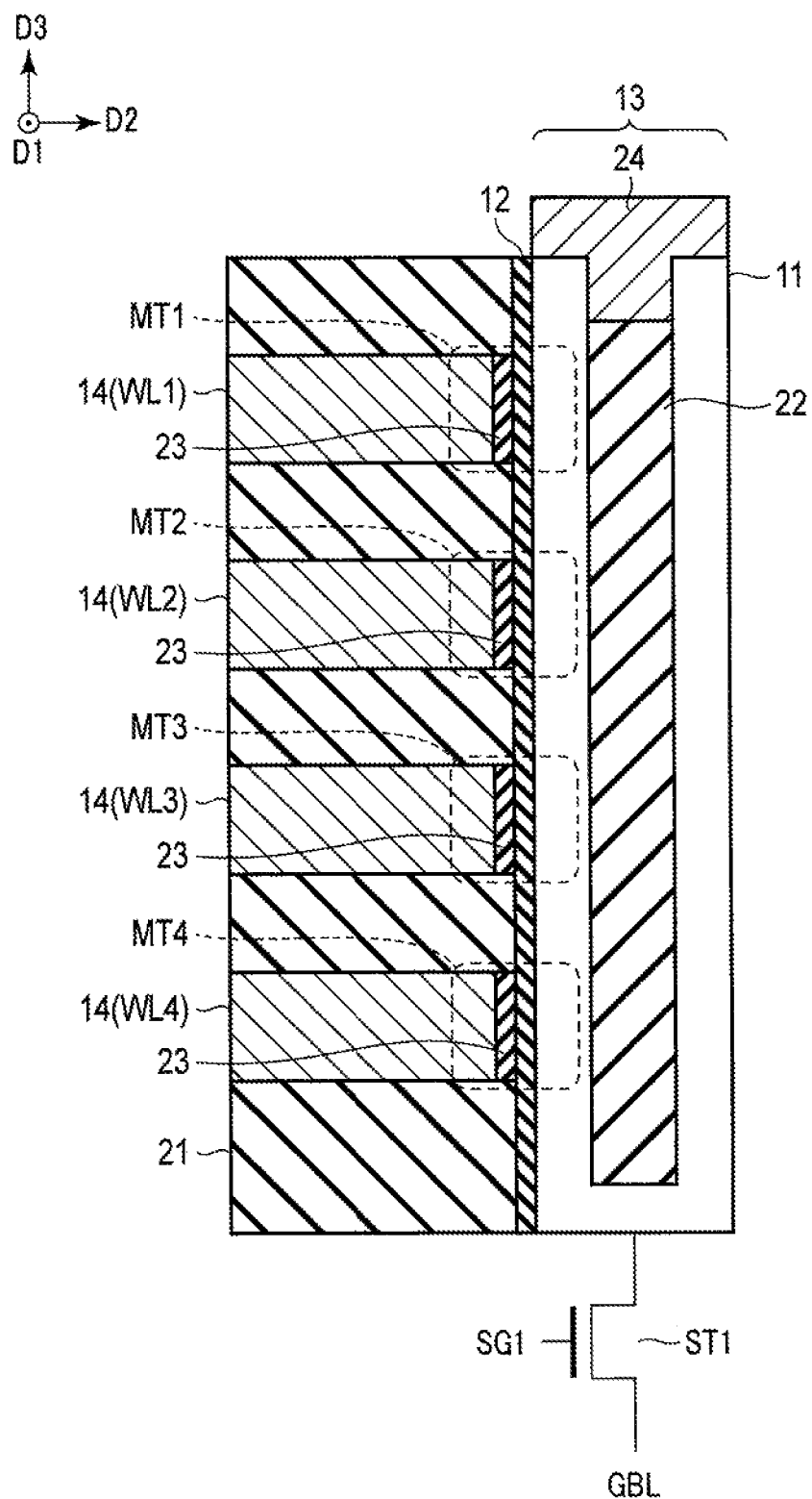
FIG. 3 is a cross-sectional view showing a part of the memory cell array in the nonvolatile semiconductor memory device according to the first embodiment.

In general, according to one embodiment, a nonvolatile semiconductor memory device includes: a semiconductor substrate; a first interconnect layer provided above the semiconductor substrate, and extending in a first direction; a plurality of second interconnect layers provided above the first interconnect layer, extending in a second direction intersecting with the first direction, and arranged along a third direction intersecting with the first direction and the second direction and vertical to the semiconductor substrate; a semiconductor layer extending in the third direction, and electrically coupled to the first interconnect layer; a first insulating layer extending in the third direction, and provided between the semiconductor layer and the plurality of second interconnect layers; and a plurality of first oxide layers in which one side of the first oxide layers is in contact with the plurality of second interconnect layers while the other side of the first oxide layers is in contact with the first insulating layer, and a voltage is applied to the plurality of second interconnect layers to vary a resistance value of the plurality of first oxide layers.

1. First Embodiment

A nonvolatile semiconductor memory device according to the first embodiment will be described.

1.1 Configuration

1.1.1 Overall Configuration of Nonvolatile Semiconductor Memory Device

First, an overall configuration of a nonvolatile semiconductor memory device according to the present embodiment will be described with reference to FIG. 1. FIG. 1 is an example of a block diagram showing a basic overall configuration of the nonvolatile semiconductor memory device. It should be noted that in FIG. 1, a part of a coupling between blocks is indicated by arrows, but the coupling between blocks is not limited to these.

As shown in FIG. 1, the nonvolatile semiconductor memory device 1 includes a memory cell array 2, a WL decoder 3, a sense amplifier 4, a selector decoder 5, a control circuit 6, and a voltage generator 7.

The memory cell array 2 includes a plurality of memory cell transistors arranged in a matrix. The memory cell transistors store data in a nonvolatile manner. Details of the memory cell transistors will be explained later.

The WL decoder 3 includes a word line selecting unit and a word line driver (not shown). The word line selecting unit selects a word line WL, based on a WL address received from the control circuit 6. The word line driver applies voltages necessary for a data read operation, write operation, etc., to a selected word line WL and an unselected word line WL.

The sense amplifier 4 selects a global bit line GBL based on a GBL address received from the control circuit 6, and applies voltages necessary for data read operation, write operation, etc. The sense amplifier 4 senses data read from the memory cell transistor during the data read operation. The sense amplifier 4 transfers write data to the memory cell transistor during the data write operation.

The selector decoder 5 includes a selector selecting unit and a selector driver (not shown). The selector selecting unit selects select gate lines SG1 and SG2 based on a selector address received from the control circuit 6. The selector driver applies voltages necessary for data read operation, write operation, etc. to selected select gate lines SG1 and SG2, and unselected select gate lines SG1 and SG2.

The control circuit 6 controls the entire operation of the nonvolatile semiconductor memory device 1. More specifically, the control circuit 6 controls the WL decoder 3, the sense amplifier 4, the selector decoder 5, and the voltage generator 7, during the read operation, the write operation, etc. The control circuit 6 transmits the WL address to the WL decoder 3, transmits the GBL address to the sense amplifier 4, and transmits the selector address to the selector decoder 5.

The voltage generator 7 generates necessary voltages in accordance with the control by the control circuit 6, and supplies the voltages to the WL decoder 3, the sense amplifier 4, the selector decoder 5, etc.

1.1.2 Configuration of Memory Cell Array

Figure 5:
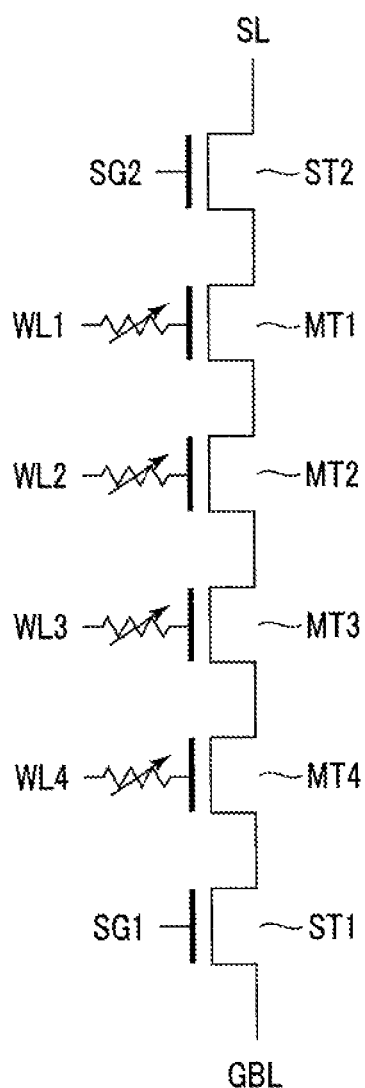
FIG. 5 is an equivalent circuit diagram of a memory string in the nonvolatile semiconductor memory device according to the first embodiment.

Next, a configuration of the memory cell array 2 according to the present embodiment will be described with reference to FIG. 2 to FIG. 4. FIG. 2 is a perspective view of the memory cell array 2. FIG. 3 is a partial cross-sectional view of the memory cell array 2. FIG. 4 is a cross-sectional view of the memory cell transistor. FIG. 5 shows an example of an equivalent circuit of a memory string. In the example of FIG. 2, interlayer insulating films are omitted. The example of FIG. 3 schematically shows a select transistor ST1, i.e., TFT, for simplifying the explanation.

As shown in FIG. 2, the memory cell array 2 is provided with GBL interconnect layers 10 functioning as global bit lines GBL, WL interconnect layers 14 functioning as word lines WL1 to WL4, memory strings 13, and select transistors ST1. The numbers of global bit lines GBL, word lines WL, and memory strings 13 can be set in a discretionary manner.

Each of the GBL interconnect layers 10 functioning as global bit lines GBL extends in the second direction D2 parallel to the semiconductor substrate, and is disposed along the first direction D1 parallel to the semiconductor substrate and vertical to the second direction D2, for example, disposed in a lowermost layer of the memory cell array 2. The GBL interconnect layers 10 are made of a conductive material, an example of which includes tungsten (W), etc. as a metallic material.

A plurality of WL interconnect layers 14 functioning as word lines WL are provided at a higher position than the GBL interconnect layers 10 (global bit lines GBL) in the third direction D3 vertical to the semiconductor substrate. Each of the WL interconnect layers 14 extends in the first direction D1, and is disposed along the second direction D2. The WL interconnect layers 14 are provided on a plurality of layers (first layer, second layer, ...) in the third direction D3 while interlayer insulating films (not shown) are interposed therebetween. In the example of FIG. 2, four WL interconnect layers 14 (first layer to fourth layer) are provided, which function as word lines WL1 to WL4, respectively. In the following, when the WL interconnect layers 14 of the first to fourth layers are distinguished, a WL interconnect layer 14 of the uppermost layer (first layer) functioning as a word line WL1 is referred to as a first WL interconnect layer 14. A WL interconnect layer of the second layer functioning as a word line WL2 is referred to as a second WL interconnect layer 14. A WL interconnect layer of the third layer functioning as a word line WL3 is referred to as a third WL interconnect layer 14. A WL interconnect layer of the lowermost layer (fourth layer) functioning as a word line WL4 is referred to as a fourth WL interconnect layer 14. The number of layers of the WL interconnect layers 14 can be set in a discretionary manner.

Each of the memory strings 13 is provided with a semiconductor layer 11 and an insulating layer 12. The memory strings 13 extend in the third direction D3 between the adjacent WL interconnect layers 14 along the second direction D2, and are arranged along the first direction D1 and the second direction D2. One end (bottom surface) of the memory string 13 is coupled to the upper end of a later-described select transistor ST1. In a two-dimensional plane defined by the first direction D1 and the second direction D2, the memory strings 13 arranged in the same row along the second direction D2 are electrically coupled to the same GBL interconnect layer 10.

A region surrounded by one word line WL and one memory cell string 13 functions as one memory cell transistor MT. The semiconductor layer 11 is a region where a channel of the memory cell transistor MT is formed. The insulating layer 12 is provided between the WL interconnect layer 14 and the semiconductor layer 11. The insulating layer 12 is formed on at least a part of the side surface of the memory string 13. The insulating layer 12 is provided to prevent a leak current from flowing between the word line WL and the semiconductor layer 11 when a voltage is applied to the word line WL, for example. The insulating layer 12 in the present embodiment is provided on the side surface of the memory string 13 adjacent to the WL interconnect layer 14 in the second direction D2. The insulating layer 12 may be provided to surround the side surfaces of the semiconductor layer 11.

A select transistor ST1 is provided between the interconnect layer 10 and the memory string 13 that is electrically coupled to the interconnect layer 10. The select transistor ST1 is, for example, a thin film transistor (TFT). In the following, a description will be given based on the case where the select transistor ST1 is a TFT. The select transistor ST1 includes a source region 15, a channel region 16, a drain region 17, a gate insulating layer 18, and a SG1 interconnect layer 19 functioning as a select gate line SG1.

The source region 15, the channel region 16, and the drain region 17 are formed in order on the GBL interconnect layer 10 in the third direction D3. The memory string 13 is formed on the drain region 17. For the source region 15 and the drain region 17, polycrystalline silicon doped with phosphorus (P) is used, for example. For the semiconductor layer 16, polycrystalline silicon is used, for example. The gate insulating layer 18 is formed on the side surfaces of the source region 15, the channel region 16, and the drain region 17. For the gate insulating layer 18, a silicon oxide film ($SiO_2$) is used, for example.

Furthermore, the SG1 interconnect layer 19, which is in contact with the gate insulating layer 18 in the second direction D2 and extends in the first direction D1, is provided. The SG1 interconnect layer 19 is coupled in common to the insulating layers 18 of the plurality of select transistors ST1 arranged along the first direction D1. The SG1 interconnect layers 19 are made of a conductive material. For example, a metallic material such as W, etc. may be used. Viewed from the second direction D2, the SG1 interconnect layer 19 overlaps the upper part of the source region 15, the entire channel region 16, and the lower part of the drain region 17. In the present embodiment, one select transistor ST1 includes two SG1 interconnect layers 19. That is, the select transistor ST1 includes two gate insulating layers 18 coupled to different SG1 interconnect layers 19, with respect to one set of the source region 15, the channel region 16, and the drain region 17. In other words, one memory string 13 is provided with two TFTs, and these TFTs share the source region 15, the channel region 16, and the drain region 17, and include the gates coupled to different select gate lines SG1. In the example of FIG. 2, the SG1 interconnect layers 19 are provided on both sides of the select transistor ST1, but the SG1 interconnect layer 19 may be provided on one side.

Next, the configuration of the memory cell transistor MT will be described in detail.

As shown in FIG. 3, the memory string 13 extending in the third direction D3 is formed in such a manner that the bottom surface is coupled to the TFT. The memory string 13 includes the insulating film 12, the semiconductor layer 11, and the insulating layer 22. One side surface of the semiconductor layer 11 is in contact with the insulating layer 12, and the other side surface is in contact with the insulating layer 22. The insulating layer 22 is provided in the semiconductor layer 11. The upper part of the memory string 13 is provided with an electrode 24. The electrode 24 can couple, for example, the semiconductor layer 11 and a interconnect layer (source line) (not shown).

For the semiconductor layer 11, at least one of silicon (Si), germanium (Ge), or a compound thereof is used. In the following, a description will be given based on the case where polycrystalline silicon is used.

The film thickness of the insulating layer 12 in the second direction D2 is preferably 5 nm or more and 10 nm or less. If the thickness of the insulating layer 12 is less than 5 nm, a leak current increases, and a load of the driver of the GBL interconnect layer 10 becomes large when the current flows in the memory string 13. That is, a current necessary for cell drive in the GBL interconnect layer 10 becomes unable to flow. If the insulating layer 12 has a film thickness of more than 10 nm, a gap between the word line WL and the memory string 13 increases, and the size of the memory cell transistor MT increases, which results in an increase of chip area. If a hole is provided in the insulating layer 21 to form the memory string 13 and the insulating layer 12 is formed on the side surface thereof, if the insulating layer 12 has a film thickness of more than 10 nm, the possibility of occurrence of embedding defects in the hole increases.

For the insulating layer 12, an aluminum oxide ($AlO_x$) is used, for example. The insulating layer 12 is not limited to $AlO_x$, and may be a hafnium oxide ($HfO_x$), zirconium oxide ($ZrO_x$), tantalum oxide ($TaO_x$), $SiO_2$, germanium oxide ($GeO_x$), or a high resistance oxide using a stacked layer film thereof. The thickness and the materials of the insulating layer 12, etc. can be searched by energy dispersive X-ray spectroscopy (EDX) mapping of FE-TEM, etc.

For the insulating layer 22, $SiO_2$ is used, for example. The electrode 24 is made of a conductive material. For example, polycrystalline silicon doped with P may be used, and a metallic material such as W, etc. may be used.

The WL interconnect layers 14 are stacked in the third direction D3 while interlayer insulating layers 21 are interposed therebetween. That is, word lines WL4 to WL1 are stacked in order from the bottom layer. One side of each of the WL interconnect layers 14 is in contact with the memory string 13 through oxide layers 23. The region surrounded by the first WL interconnect layer 14 functioning as the word line WL1 and the memory string 13 functions as a memory cell transistor MT1. The same applies to the word lines WL2 to WL4. The regions surrounded by the corresponding second to fourth WL interconnect layers 14 and the memory string 13 function as memory cell transistors MT2 to MT4, respectively.

The WL interconnect layers 14 are made of a conductive material, and for example, titanium nitride (TiN) or a metallic material such as W, etc., may be used. When W is used for the WL interconnect layers 14, for example, TiN may be formed as barrier metal of W in an interface between the insulating layer 21 and W.

The oxide layer 23 is a resistance change film with oxygen defects (holes). Oxygen defects of the oxide layer 23 move in the oxide layer 23 in accordance with an electric field between the word line WL and the semiconductor layer 11. In other words, an oxygen concentration distribution in the oxide layer 23 is controlled by the electric field.

As illustrated in FIG. 4, for example, if oxygen defects in the oxide layer 23 are eccentrically located in a vicinity of the interface with the insulating layer 12, a resistance value of the oxide layer 23 becomes higher, and band alignment of the interface between the oxide layer 23 and the semiconductor layer 11 changes. As a result, a channel resistance in the semiconductor layer 11 changes, and a threshold voltage Vth of the memory cell transistor MT necessary for channel inversion becomes lower. On the other hand, if oxygen defects in the oxide layer 23 are not eccentrically located in a vicinity of the interface with the insulating layer 12, a resistance value of the oxide layer 23 becomes lower, and the threshold voltage Vth of the memory cell transistor MT becomes higher. Thus, in accordance with the distribution of oxygen concentration of the oxide layer 23, the threshold voltage Vth of the memory cell transistor MT varies. Thereby, the memory cell transistor MT can store data associated with the threshold voltage Vth in a nonvolatile manner. The memory cell transistor MT can store data of two bits (quaternary) or more in accordance with the threshold level. In the following, a description will be given based on the case where the memory cell transistor MT can hold data of one bit (binary).

The film thickness of the oxide layer 23 in the second direction D2 is preferably 5 nm or more and 20 nm or less. If the oxide layer 23 has a film thickness of less than 5 nm, the oxide layer 23 is not crystallized. If the oxide layer 23 has a film thickness of more than 20 nm, a gap between the word line WL and the memory string 13 increases, and the size of the memory cell transistor MT increases, which results in an increase of chip area. Moreover, the possibility that embedding defects occur when the oxide layer 23 is formed on the side surface of the WL interconnect layer 14 increases.

For the oxide layer 23, for example, low resistance high dielectric metal oxide is used, an example of which includes crystallized titanium oxide ($TiO_x$), tungsten oxide ($WO_x$), niobium oxide ($NbO_x$), or molybdenum oxide ($MoO_x$). In the following, a description will be given based on the case where $TiO_x$ is used for the oxide layer 23.

Next, an equivalent circuit corresponding to the memory cell transistors MT1 to MT4 will be described. In the following description, if the source and the drain of the transistor are not specified, one of the source and the drain of the transistor is referred to as "one end of the transistor" and the other is referred to as "the other end of the transistor."

As illustrated in FIG. 5, the memory cell transistors MT1 to MT4 have their current paths coupled in series. The memory cell transistors MT1 to MT4 have their gates coupled to the word lines WL1 to WL4, respectively, through variable resistance elements. One end of the memory cell transistor MT1 is coupled to one end of the select transistor ST2. The other end of the select transistor ST2 is coupled to the source line SL, and the gate of the select transistor ST2 is coupled to the select gate line SG2. The select transistor ST2 is a transistor for coupling the memory string 13 and the source line SL. The select transistor ST2 may be provided inside the memory string 13, may be provided above the memory string 13 in the third direction D3, or may be provided in a region different from the memory cell array 2. A voltage is applied to the select gate line SG2 from the selector decoder 5. A voltage is applied to the source line SL from the voltage generator 7 through, for example, a source line driver (not shown). One end of the memory cell transistor MT4 is coupled to the select transistor ST1. The other end of the select transistor ST1 is coupled to the global bit line GBL, and the gate of the select transistor ST1 is coupled to the select gate line SG1.

1.2 Erase Operation

Next, an erase operation will be described. The erase operation includes an erase voltage application operation and an erase verify operation.

The erase voltage application operation is an operation for lowering a threshold voltage Vth of the memory cell transistors MT, i.e., an operation for causing oxygen defects in the oxide layer 23 to be eccentrically located in a vicinity of the interface with the insulating layer 12 to increase a resistance value of the oxide layer 23.

The erase verify operation is an operation performed after the erase voltage application operation to read data to determine whether the threshold voltage Vth of the memory cell transistor MT has reached a target level as a target.

1.2.1 Voltages of Interconnects in Erase Voltage Application Operation

Figure 6:
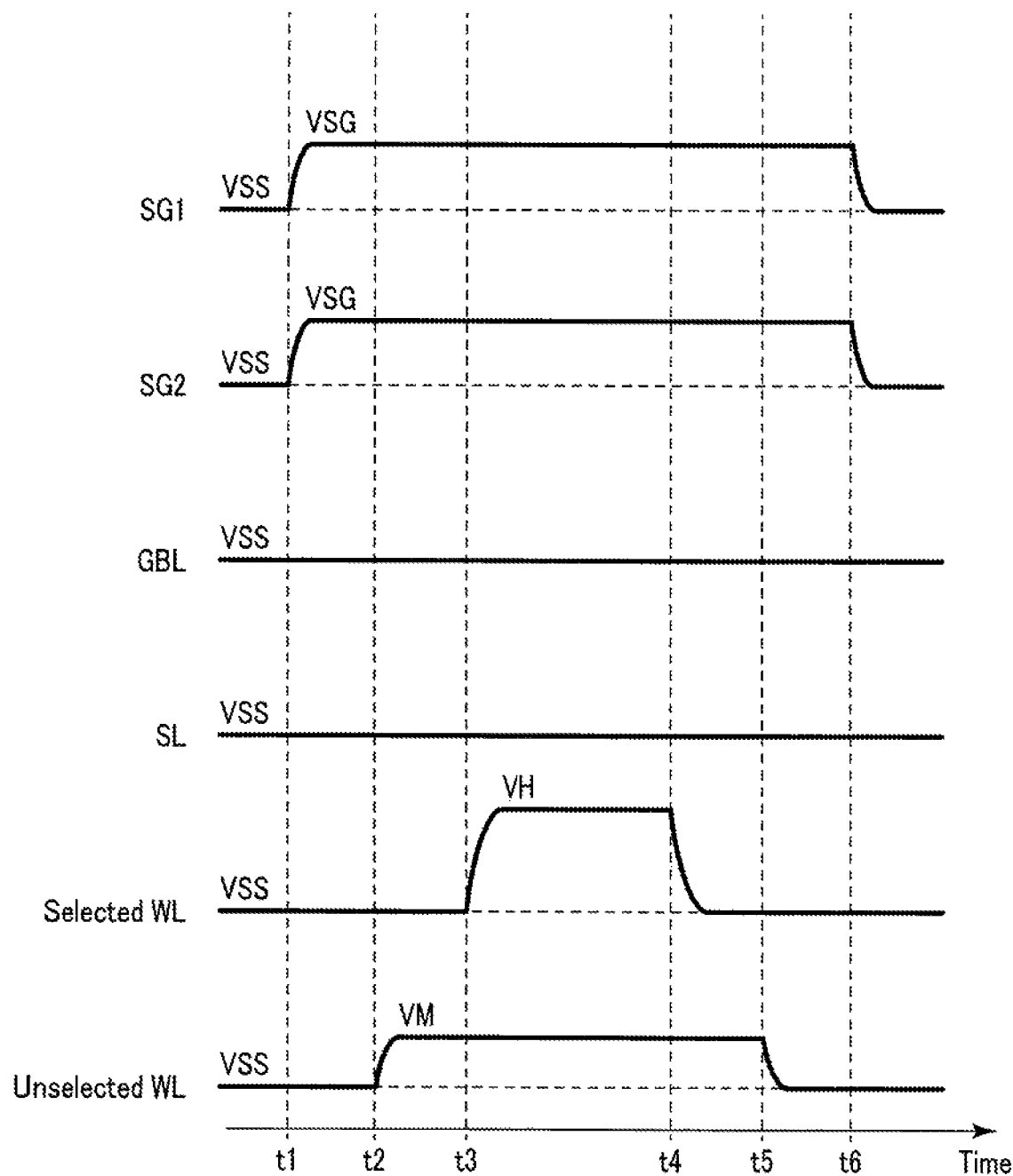
FIG. 6 shows voltages of interconnects during an erase voltage application operation in the nonvolatile semiconductor memory device according to the first embodiment.

Next, voltages of interconnects in the erase voltage application operation will be described with reference to FIG. 6. FIG. 6 is a timing chart showing voltages of interconnects in the erase voltage application operation.

As shown in FIG. 6, at time t1, the selector decoder 5 applies a voltage VSG to selected select gate lines SG1 and SG2. The voltage VSG is a voltage for setting the select transistors ST1 and ST2 to an ON state. Thereby, an erase target memory string 13 is selected.

Next, at time t2, the WL decoder 3 applies a voltage VM to an unselected word line WL. The voltage VM is a voltage indicating a half-selected state. For example, it is preferable that the voltage VM is set to an intermediate voltage between the voltage of the selected word line WL and the voltage of the channel, so as to control widening of the channel formed between the selected word line WL and the adjacent unselected word line WL in the semiconductor layer 11. More specifically, in the example of FIG. 6, the voltage VM is VM=(VH−VSS)/2. The voltage VM is set to a voltage at which oxygen defects in the oxide layer 23 do not move due to a potential difference between the gate and the channel in the memory cell transistor MT (the threshold voltage Vth does not vary sufficiently to cause the threshold level to vary). The voltage VM turns on a memory cell transistor MT coupled to the unselected word line WL of the selected memory string 13 (hereinafter referred to as "unselected memory cell transistor MT").

Next, at time t3, the WL decoder 3 applies a voltage VH to a selected word line WL. The voltage VH is a high voltage for moving oxygen defects in the oxide layer 23. The voltage VH may be, for example, a voltage of approximately 10 V or below. In the selected memory string 13, since the select transistors ST1 and ST2 are in an ON state, a channel potential of the memory cell transistor MT is VSS. Thus, in a memory cell transistor MT coupled to the selected word line WL (hereinafter referred to as "selected memory cell transistor MT"), a potential difference between the gate and the channel becomes larger, and an electrical field is generated in the channel direction from the gate. Consequently, oxygen defects in the oxide layer 23 move to the interface side with the insulating layer 12, and the threshold voltage Vth of the corresponding selected memory cell transistor MT is lowered.

Next, at time t4, the WL decoder 3 applies the voltage VSS to the selected word line WL.

Next, at time t5, the WL decoder 3 applies the voltage VSS to the unselected word line WL.

Next, at time 6, the selector decoder 5 applies the voltage VSS to the select gate lines SG1 and SG2, and the erase voltage application operation is completed.

During the period of times t2 and t3 and the period of times t4 and t5, the WL decoder 3 may apply the voltage VM to the selected word line WL. When the combination of the erase voltage application operation and the erase verify operation is repeated, the voltages VH and VM may be stepped up.

1.3 Write Operation

Next, a write operation will be described. The write operation includes a program operation and a program verify operation. By repeating the combination of the program operation and the program verify operation, the threshold voltage Vth of the memory cell transistor MT is set to a target level. For example, when the memory cell transistor MT can hold quaternary (2-bit) or more data, threshold voltages Vth corresponding to the respective target levels are set.

The program operation is an operation for increasing the threshold voltage Vth of the memory cell transistors MT, i.e., an operation for causing oxygen defects in the oxide layer 23 to be not eccentrically located in a vicinity of the interface with the insulating layer 12 so as to lower a resistance value of the oxide layer 23.

The program verify operation is an operation performed after the program operation to read data to determine whether the threshold voltage of the memory cell transistor MT has reached a target level as a target.

1.3.1 Voltages of Interconnects in Program Operation

Next, voltages of interconnects in the program operation will be described with reference to FIG. 7. FIG. 7 is a timing chart showing voltages of interconnects in the program operation.

As shown in FIG. 7, at time t1, the voltage VH is applied to a selected global bit line GBL and a source line SL. The WL decoder 3 applies the voltage VM to selected and unselected word lines WL. During a period of times t1 and t2, the global bit line GBL and the source line SL are pre-charged by the voltage VH.

Next, at time t2, the selector decoder 5 applies the voltage VSG to the selected select gate lines SG1 and SG2 to set the select transistors ST1 and ST2 to an ON state.

Next, at time t3, the WL decoder 3 applies a voltage VL (e.g., the voltage VSS) to the selected word line WL. The voltage VL is a voltage for moving oxygen defects in the oxide layer 23 to the word line WL side. In the selected memory cell transistor MT coupled to the selected word line WL, a potential difference between the gate and the channel becomes large, and an electrical field is generated in the direction from the channel to the gate. As a result, oxygen defects in the oxide layer 23 move to the vicinity of the interface with the word line WL, and the threshold voltage Vth of the corresponding selected memory cell transistor MT increases.

Next, at time t4, the WL decoder 3 applies the voltage VM to the selected word line WL.

Next, at time t5, the selector decoder 5 applies the voltage VSS to the select gate lines SG1 and SG2.

Next, at time t6, the voltage VSS is applied to the global bit line, the source line, and the selected and unselected word lines WL, and the program operation is completed.

When the combination of the program operation and the program verify operation is repeated, the voltages VH and VM may be stepped up.

1.4 Read Operation

Next, a read operation will be described.

1.4.1 Voltages of Interconnects in Read Operation

Next, voltages of interconnects in the read operation will be described with reference to FIG. 8. FIG. 8 is a timing chart showing voltages of interconnects in the read operation.

As shown in FIG. 8, at time t1, the WL decoder 3 applies a voltage V_read_L to the selected word line WL, and applies a voltage V_read_H to the unselected word line WL. The voltage V_read_L is a voltage corresponding to a threshold level of data to be read. If the threshold voltage Vth of the memory cell transistor MT is lower than the voltage V_read_L, the memory cell transistor MT is set to an ON state. The voltage V_read_H is a voltage for setting the memory cell transistor MT to an ON state regardless of the threshold voltage Vth of the memory cell transistor MT. The voltage V_read_H is lower than the voltage VH. The voltages V_read_L and V_read_H have a relationship V_read_L<V_read_H.

Next, at time t2, the selector decoder 5 applies the voltage VSG to the select gate lines SG2 to set the select transistor ST2 to an ON state.

Next, at time t3, the sense amplifier 4 applies a voltage Vread to the global bit line GBL. The voltage Vread is a voltage applied to the selected global bit line GBL in the read operation. The voltage Vread is higher than the voltage V_read_L and lower than the voltage V_read_H.

During a period of times t3 and t4, the global bit line GBL is pre-charged by the voltage Vread.

Next, at time t4, the selector decoder 5 applies the voltage VSG to the select gate line SG1 to set the select transistor ST1 to an ON state. When the selected memory cell transistor MT is in an ON state, i.e., the threshold voltage Vth is less than the voltage V_read_L, a current flows in the source line SL from the global bit line GBL. Thus, the voltage of the global bit line GBL is lowered. On the other hand, when the selected memory cell transistor MT is in an OFF state, i.e., when the threshold voltage Vth is equal to or more than the voltage V_read_L, a current does not flow in the source line SL from the global bit line. GBL. Accordingly, the voltage of the global bit line GBL hardly varies. The sense amplifier 4 determines whether the selected memory cell transistor MT is in an ON state by sensing voltage variations in the global bit line GBL or the current flowing in the source line SL, to thereby read data.

Next, at time t5, the selector decoder 5 applies the voltage VSS to the select gate line SG1 to set the select transistor ST1 to an OFF state.

Next, at time t6, the selector decoder 5 applies the voltage VSS to the select gate line SG2 to set the select transistor ST2 to an OFF state. The sense amplifier 4 applies the voltage VSS to the global bit line GBL.

Next, at time t7, the WL decoder 3 applies the voltage VSS to the selected and unselected word lines WL, and the read operation is completed.

1.5 Effects According to Present Embodiment

According to the configuration of the present embodiment, it is possible to provide a nonvolatile semiconductor memory device capable of lowering the write voltage. Details of the effects will be described.

For a NAND-type flash memory, the charge storage layer is provided between the gate insulating layer and the gate electrode, and charges are injected into this charge storage layer to vary the threshold voltages of the memory cell transistor to thereby write data. In the NAND-type flash memory, a write voltage of 20 V or more is required, for example, to inject charges into the charge storage layer.

In contrast, according to the configuration of the present embodiment, the memory cell transistor MT includes the oxide layer 23 including oxygen defects between the gate insulating layer and the gate electrode. The concentration distribution of oxygen defects in the oxide layer 23 is controlled to vary the threshold voltages Vth of the memory cell transistors MT to write data. In other words, the configuration of the present embodiment only requires movement of oxygen in the oxide layer 23 by the electric field between the gate electrode and the channel, which only requires a write voltage of 10 V or less, for example. The write voltage can be lowered.

Since the writ operation and the erase operation can be performed by moving oxygen in the oxide layer 23, it is possible to shorten write time and erase time. Thus, processing ability of the nonvolatile semiconductor memory device 1 can be improved.

Moreover, since the memory cell transistors MT are three-dimensional stacked memories stacked on a semiconductor substrate, it is possible to suppress an increase in chip area by high integration and to configure a high-capacity memory.

Furthermore, the memory cell transistors MT can hold data of 2 bits or more in accordance with the distribution of the threshold voltages.

Furthermore, when data on the memory cell transistors MT is erased, an erase operation can be performed by selecting one memory cell transistor MT. In other words, it is possible to perform erasing by random access.

2. Second Embodiment

Next, the second embodiment will be described. The second embodiment describes two examples for a cross-sectional configuration of a memory cell array 2 different from that of the first embodiment. In the following, the matters different from those of the first embodiment will be described.

2.1 First Example

Figure 9:
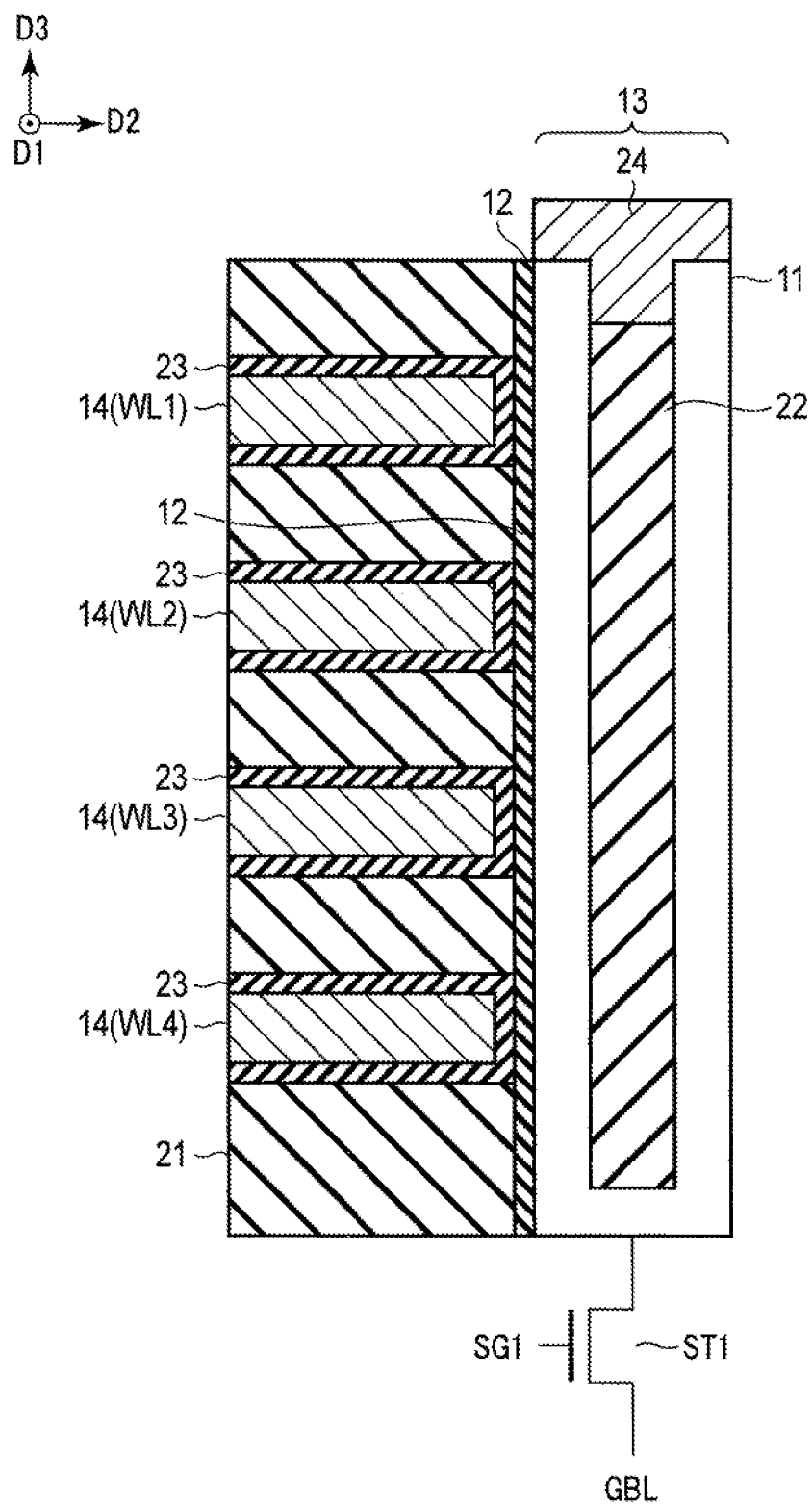
FIG. 9 is a cross-sectional view showing a part of the memory cell array in a nonvolatile semiconductor memory device according to a first example of a second embodiment.

First, a configuration of the memory cell array 2 of the first example will be described with reference to FIG. 9. FIG. 9 is a partial cross-sectional view of the memory cell array 2. For simplifying the explanation, the example of FIG. 9 schematically shows a select transistor ST1.

As illustrated in FIG. 9, in this example, the oxide layer 23 is formed to cover at least the upper surface, the bottom surface, and the side surface that is in contact with the memory string 13, of the WL interconnect layer 14. The configuration of the memory string 13 is the same as that shown in FIG. 3 of the first embodiment.

2.2 Second Example

Figure 10:
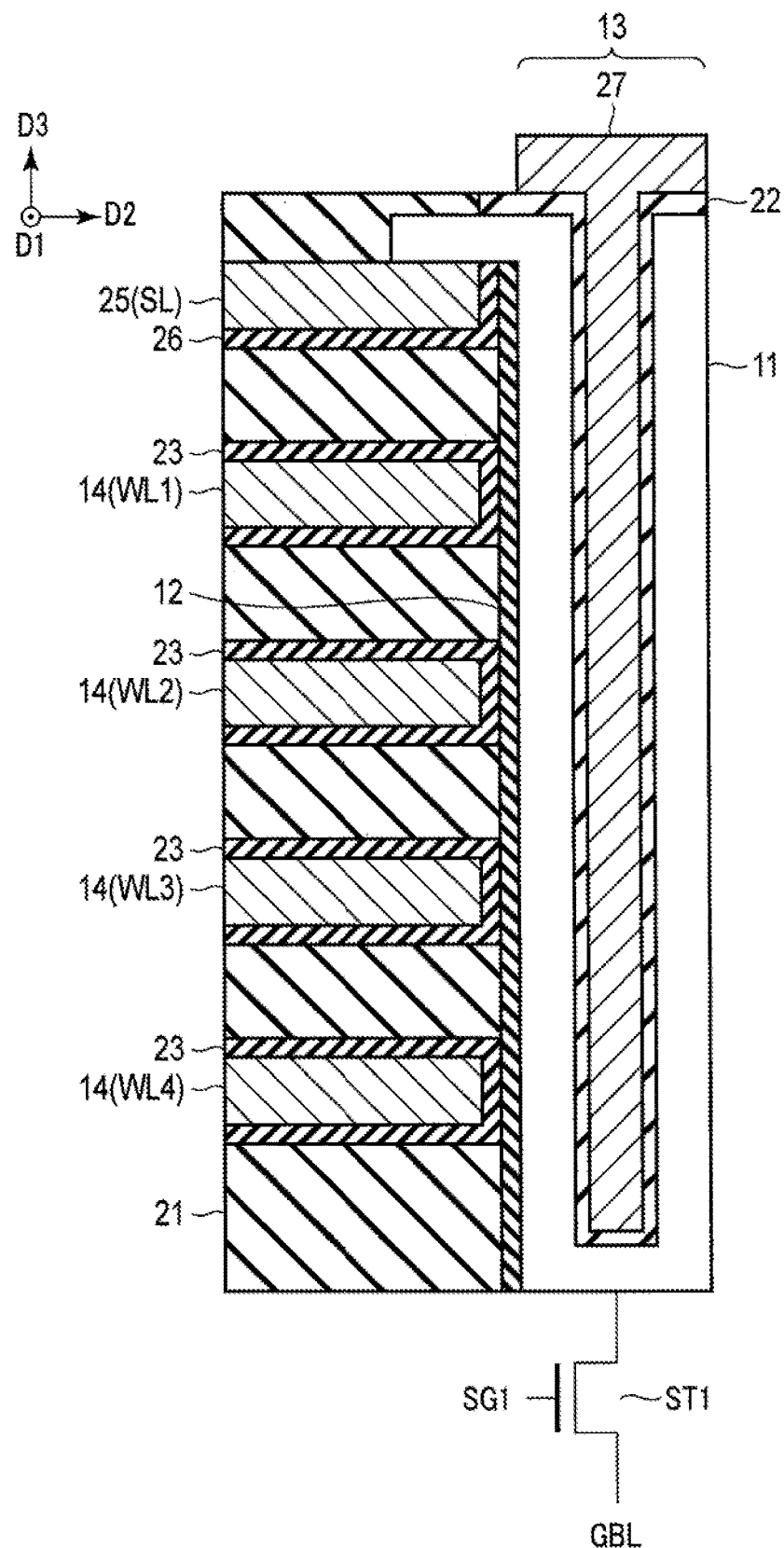
FIG. 10 is a cross-sectional view showing a part of the memory cell array in a nonvolatile semiconductor memory device according to a second example of the second embodiment.

Next, a configuration of the memory cell array 2 of the second example will be described with reference to FIG. 10. FIG. 10 is a partial cross-sectional view of the memory cell array 2. For simplifying the explanation, the example of FIG. 10 schematically shows a select transistor ST1.

As illustrated in FIG. 10, in this example, an SL interconnect layer 25 and an oxide layer 26 are provided. The SL interconnect layer 25 functions as the source line SL through the insulating layer 21 above the WL interconnect layers 14 functioning as the word line WL1. The oxide layer 26 covers the bottom surface and a part of the side surfaces of the SL source line 25. A part of the upper surface of the SL interconnect layer 25 functioning as the source line SL is electrically coupled to the semiconductor layer 11. The oxide layer 26 may be omitted. Instead of the oxide layer 26, a conductive barrier metal to suppress a reaction between the SL interconnect layer 25 and the insulating layer 21 may be used. The SL interconnect layer 25 is made of a conductive material, and the material may be the same as that of the WL interconnect layer 14, for example. The oxide layer 26 may be made of the same material as that of the oxide layer 23.

In the memory string 13, the semiconductor layer 11 is configured in such a manner that the electrode 27 and the insulating layer 22 covering the side surfaces and the bottom surface of the electrode 27 are embedded. In this example, the electrode 27 forms a channel in a vicinity of the interface with the insulating layer 22 in the semiconductor layer 11, and it functions as the gate line GL forming a path to flow a current in the source line SL from the global bit line GBL, for example. More specifically, in the write operation, for example, if the voltage VSS is applied to the gate line GL in a state where the voltage VH is applied to the global bit line GBL and the source line SL, a channel is formed in a vicinity of the interface with the insulating layer 22 in the semiconductor layer 11. This can lower a resistance of the semiconductor layer 11 and can suppress voltage dropping. On the other hand, in the read operation, for example, the same voltage VSS as that applied to the source line SL is applied to the gate line GL so that a channel is not formed in a vicinity of the interface with the insulating layer 22 in the semiconductor layer 11.

Thus, the electrode 27 of this example is coupled to an interconnect layer (not shown) functioning as the gate line GL, and for example, a voltage is applied from the sense amplifier 4, etc.

2.3 Effects According to Present Embodiment

According to the configuration of the present embodiment, the effects similar to those of the first embodiment can be obtained.

Moreover, according to the configuration of the Second Example of the present embodiment, voltage dropping in the semiconductor layer 11 can be suppressed in the write operation. This reduces the variation in write speeds among the stacked memory cell transistors MT1 to MT4, and processing ability of the nonvolatile semiconductor memory device 1 can be improved.

3. Modifications, Etc

The nonvolatile semiconductor memory device according to the above embodiments includes: a semiconductor substrate; a first interconnect layer (GBL) provided above the semiconductor substrate, and extending in a first direction (D2); a plurality of second interconnect layers (14) provided on the first interconnect layer, extending in a second direction (D1) intersecting with the first direction, and arranged along a third direction (D3) intersecting with the first direction and the second direction and vertical to the semiconductor substrate; a semiconductor layer (11) extending in the third direction, and electrically coupled to the first interconnect layer; a first insulating layer (12) extending in the third direction, and provided between the semiconductor layer and the plurality of second interconnect layers; and a plurality of first oxide layers (23) in which one side of the first oxide layers is in contact with the plurality of second interconnect layers while the other side of the first oxide layers is in contact with the first insulating layer (12), and a voltage is applied to the plurality of second interconnect layers to vary a resistance value.

The application of the above-described embodiments allow provision of a nonvolatile semiconductor memory device capable of reducing write voltages.

For example, the above embodiments have described the case where the memory string 13 is formed on the select transistor ST1, but the memory string 13 may include the select transistors ST1 and ST2.

Moreover, the above embodiments has described the three-dimensional stacked memory with memory cell transistors MT stacked on a semiconductor substrate, but the above embodiments can be applied to a plane memory with memory cell transistors MT arranged two dimensionally on a semiconductor substrate.

Furthermore, the phrase "coupling" in the above-described embodiments includes a state in which components are indirectly connected with another components such as a transistor or a resistor interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a first interconnect layer provided above the semiconductor substrate, and extending in a first direction;
   a plurality of second interconnect layers provided above the first interconnect layer, extending in a second direction intersecting with the first direction, and arranged along a third direction intersecting with the first direction and the second direction and vertical to the semiconductor substrate;
   a semiconductor layer extending in the third direction, and electrically coupled to the first interconnect layer;
   a first insulating layer extending in the third direction, and provided between the semiconductor layer and the plurality of second interconnect layers; and
   a plurality of first oxide layers provided between the plurality of second interconnect layers and the first insulating layer, each of the plurality of first oxide layers being respectively coupled to one of the plurality of second interconnect layers.

2. The device according to claim 1, wherein the semiconductor layer includes at least one of silicon, germanium, or a compound thereof.

3. The device according to claim 1, wherein the plurality of first oxide layers include at least one of titanium, tungsten, niobium, or molybdenum.

4. The device according to claim 3, wherein the plurality of first oxide layers have a film thickness of 5 nm or more and 20 nm or less in the first direction.

5. The device according to claim 1, wherein the first insulating layer includes at least one of aluminum, hafnium, zirconium, tantalum, silicon, or germanium.

6. The device according to claim 5, wherein the first insulating layer has a film thickness of 5 nm or more and 10 nm or less in the first direction.

7. The device according to claim 1, further comprising:
a first transistor provided between the first interconnect layer and the semiconductor layer along the third direction; and
a third interconnect layer extending in the second direction, and coupled to a gate of the first transistor.

8. The device according to claim 7, wherein the first transistor includes a source coupled to the first interconnect layer, and a drain coupled to the semiconductor layer.

9. The device according to claim 1, wherein a distribution of oxygen concentration in the plurality of first oxide layers varies by applying a voltage to the plurality of second interconnect layers.

10. The device according to claim 1, wherein the plurality of first oxide layers are in contact with upper surfaces and side surfaces of the plurality of second interconnect layers.

11. The device according to claim 1, further comprising a third interconnect layer provided above the plurality of second interconnect layers, extending in the second direction, and coupled to the semiconductor layer.

12. The device according to claim 11, further comprising:
a second insulating layer provided in the semiconductor layer, extending in the third direction, and including a bottom surface and a side surface that are in contact with the semiconductor layer; and
a first electrode provided in the second insulating layer, extending in the third direction, and including a bottom surface and a side surface that are in contract with the second insulating layer.

13. The device according to claim 1, wherein the plurality of second interconnect layers include third and fourth interconnect layers,
in a write operation in which the third interconnect layer is selected,
a first voltage is applied to the semiconductor layer,
a second voltage lower than the first voltage is applied to the third interconnect layer, and
an intermediate third voltage between the first voltage and the second voltage is applied to the fourth interconnect layer.

14. The device according to claim 13, wherein in a read operation in which the third interconnect layer is selected,
a fourth voltage is applied to one end of the semiconductor layer through the first interconnect layer,
the second voltage is applied to the other end of the semiconductor layer,
a fifth voltage higher than the second voltage and lower than the fourth voltage is applied to the third interconnect layer, and
a sixth voltage higher than the fourth voltage is applied to the fourth interconnect layer.

15. The device according to claim 13, wherein in an erase operation in which the third interconnect layer is selected,
the second voltage is applied to the semiconductor layer,
the first voltage is applied to the third interconnect layer, and
the third voltage is applied to the fourth interconnect layer.

16. The device according to claim 1, further comprising:
a plurality of third interconnect layers adjacent to the plurality of second interconnect layers in the first direction through the semiconductor layer, and arranged along the third direction;
a second insulating layer provided between the semiconductor layer and the plurality of third interconnect layers; and
a plurality of second oxide layers in which one side of the second oxide layers is in contact with the plurality of third interconnect layers and the other side of the second oxide layers is in contact with the second insulating layer, and a voltage is applied to the plurality of third interconnect layers to vary a resistance value of the plurality of second oxide layers.

17. A nonvolatile semiconductor memory device comprising:
a semiconductor substrate;
a first interconnect layer provided above the semiconductor substrate, and extending in a first direction;
a plurality of second interconnect layers provided above the first interconnect layer, extending in a second direction intersecting with the first direction, and arranged along a third direction intersecting with the first direction and the second direction and vertical to the semiconductor substrate;
a semiconductor layer extending in the third direction, and electrically coupled to the first interconnect layer;
a first insulating layer extending in the third direction, and provided between the semiconductor layer and the plurality of second interconnect layers;
a plurality of first oxide layers in which one side of the first oxide layers is in contact with the plurality of second interconnect layers while the other side of the first oxide layers is in contact with the first insulating layer; and
a second insulating layer provided between the plurality of second interconnect layers, the second insulating layer being in contact with the first insulating layer.

18. The device according to claim 17, wherein the second insulating layer is provided between the plurality of first oxide layers.

* * * * *